(12) United States Patent
Goshi

(10) Patent No.: US 12,374,565 B2
(45) Date of Patent: Jul. 29, 2025

(54) SUBSTRATE DRYING METHOD AND SUBSTRATE DRYING APPARATUS

(71) Applicant: Tokyo Electron Limited, Tokyo (JP)

(72) Inventor: Gentaro Goshi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 835 days.

(21) Appl. No.: 17/644,406

(22) Filed: Dec. 15, 2021

(65) Prior Publication Data

US 2022/0208566 A1    Jun. 30, 2022

(30) Foreign Application Priority Data

Dec. 25, 2020  (JP) ................................. 2020-217062

(51) Int. Cl.
H01L 21/67 (2006.01)
H01L 21/02 (2006.01)

(52) U.S. Cl.
CPC .. H01L 21/67034 (2013.01); H01L 21/02101 (2013.01)

(58) Field of Classification Search
None
See application file for complete search history.

(56) References Cited

U.S. PATENT DOCUMENTS 9,587,880 B2 *  3/2017  Kim .................... F26B 5/005

FOREIGN PATENT DOCUMENTS

| JP | 2013-251550 A | 12/2013 |
| JP | 2018-074103 A | 5/2018 |
| JP | 2018-082099 A | 5/2018 |
| JP | 2018-152477 A | 9/2018 |
| JP | 2019-033246 A | 2/2019 |
| JP | 2022-051531 A | 3/2022 |

* cited by examiner

*Primary Examiner* — Jason Lau
(74) *Attorney, Agent, or Firm* — Armstrong Teasdale LLP

(57) ABSTRACT

A substrate processing method includes: a pressure increasing process of increasing an internal pressure of a process container to a processing pressure by supplying a process fluid into the process container; and after the pressure increasing process, a circulating process of supplying the process fluid from a second discharge part into the process container and discharging the process fluid in the process container from a fluid discharge part, while maintaining the internal pressure at the processing pressure, wherein the pressure increasing process includes: a first pressure increasing stage of increasing the internal pressure to a switching pressure by supplying the process fluid from a first discharge part into the process container; and after the first pressure increasing stage, a second pressure increasing stage of increasing the internal pressure from the switching pressure to the processing pressure by supplying the process fluid from the second discharge part into the process container.

13 Claims, 6 Drawing Sheets

SUBSTRATE DRYING METHOD AND SUBSTRATE DRYING APPARATUS

CROSS-REFERENCE TO RELATED APPLICATION

This application is based upon and claims the benefit of priority from Japanese Patent Application No. 2020-217062, filed on Dec. 25, 2020, the entire contents of which are incorporated herein by reference.

TECHNICAL FIELD

The present disclosure relates to a substrate drying method and a substrate drying apparatus.

BACKGROUND

In recent years, in manufacturing semiconductor devices, a supercritical drying process has been performed in which a substrate having an upper surface wet with a process liquid is brought into contact with a process fluid in a supercritical state to replace the process liquid with the process fluid in the supercritical state, thereby drying the substrate. Patent Document 1 describes a supercritical drying method and an apparatus for carrying out the method. In the supercritical drying method described in Patent Document 1, a supercritical fluid is first supplied from a lower supply port into a chamber (process container), and after the internal pressure of the chamber reaches a critical pressure, the supercritical fluid is supplied at a large flow rate from an upper supply port into the chamber. It is designed such that the supercritical fluid discharged from the lower supply port spreads into the chamber after colliding with a blocking plate so that the supercritical fluid does not reach a substrate directly. On the other hand, the supercritical fluid discharged from the upper supply port is provided so as to be directed to a surface of the substrate.

PRIOR ART DOCUMENT

[Patent Document]
Patent Document 1: Japanese Laid-open Publication No. 2013-251550

SUMMARY

An aspect of the present disclosure provides a substrate processing method performed by using a substrate processing apparatus. The substrate processing apparatus includes: a process container in which a substrate is accommodated; a substrate holder configured to hold the substrate horizontally in the process container in a state where a front surface of the substrate on which a liquid film is formed faces upward; a main supply line connected to a process fluid supply part that supplies a process fluid in a supercritical state; a first branch supply line and a second branch supply line that branch from the main supply line at a first branch point set in the main supply line; a first discharge part connected to the first branch supply line and configured to discharge the process fluid, which is sent from the first branch supply line, toward a space in the process container below the substrate held by the substrate holder; a second discharge part connected to the second branch supply line and configured to discharge the process fluid, which is sent from the second branch supply line, toward a space in the process container above the front surface of the substrate; a fluid discharge part configured to discharge the process fluid from the process container; and a discharge line connected to the fluid discharge part. The substrate processing method includes: a pressure increasing process of increasing an internal pressure of the process container to a predetermined processing pressure by supplying the process fluid into the process container in a state where the substrate on which the liquid film is formed is held by the substrate holder and is accommodated in the process container; and after the pressure increasing process, a circulating process of supplying the process fluid from the second discharge part into the process container and discharging the process fluid in the process container from the fluid discharge part, while maintaining the internal pressure of the process container at the processing pressure. The pressure increasing process includes: a first pressure increasing stage of increasing the internal pressure of the process container to a predetermined switching pressure by supplying the process fluid from the first discharge part into the process container; and after the first pressure increasing stage, a second pressure increasing stage of increasing the internal pressure of the process container from the switching pressure to the processing pressure by supplying the process fluid from the second discharge part into the process container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A supercritical drying apparatus as an embodiment of a substrate processing apparatus will be described with reference to the accompanying drawings.

The supercritical drying apparatus can be used for performing a supercritical drying process of drying a substrate W having a liquid film of a liquid (for example, isopropyl alcohol (IPA)) adhered to a surface of the wafer W by using a process fluid (for example, carbon dioxide) in a supercritical state. The substrate W is, for example, a semiconductor wafer, but may be another type of substrate (glass substrate or ceramic substrate) or the like used in the technical field of semiconductor device manufacture. Since a surface tension that can cause pattern collapse does not act on a pattern, a supercritical drying technique can be advantageously used for drying a substrate on which a fine and high aspect ratio pattern is formed.

Figure 1:
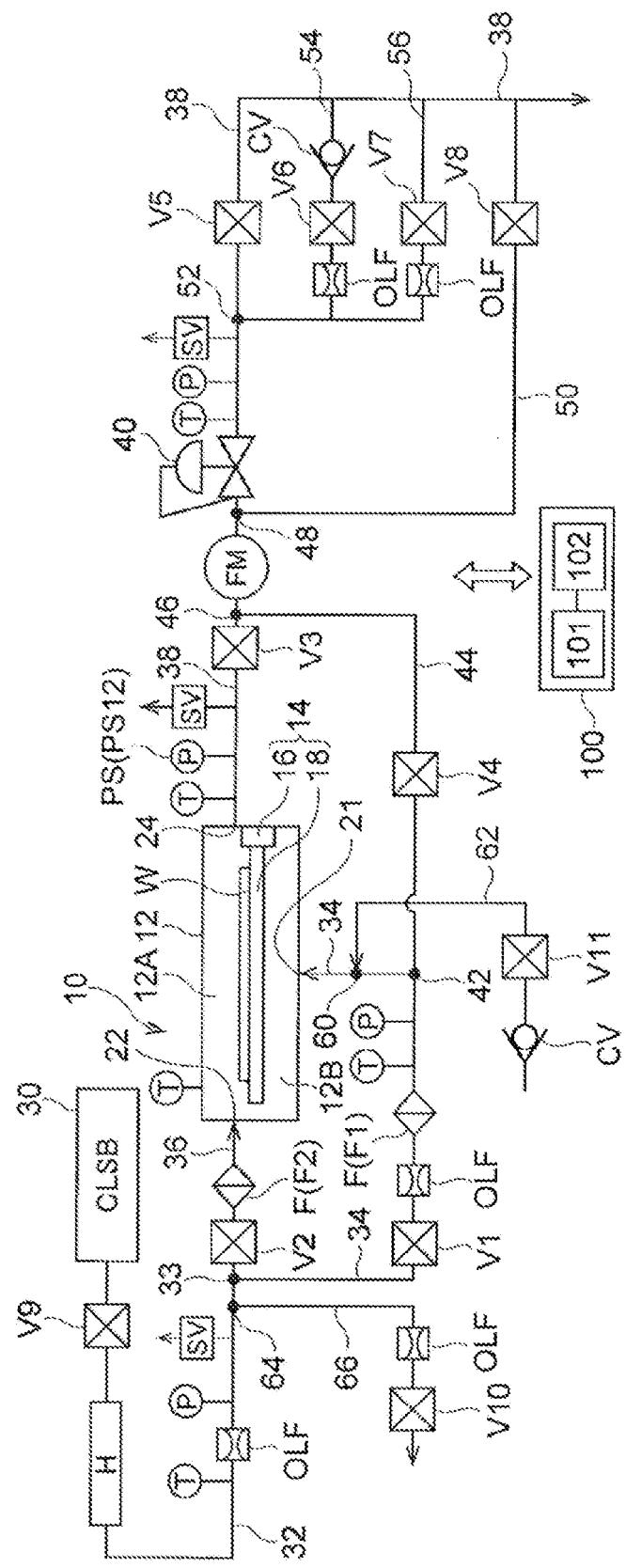
FIG. 1 is a piping system diagram of a supercritical drying apparatus according to an embodiment.

As shown in FIG. 1, the supercritical drying apparatus includes a process unit 10 in which a supercritical drying process is performed. The process unit 10 has a process container 12 and a substrate holding tray 14 (hereinafter simply referred to as a "tray 14") for holding the substrate W in the process container 12.

In one embodiment, the tray 14 has a lid 16 that closes an opening formed in a side wall of the process container 12, and a horizontally extending substrate support plate (substrate holder) 18 (hereinafter simply referred to as a "plate 18") that is connected to the lid 16. The substrate W is placed horizontally on the plate 18 with a front surface of the wafer W (a surface on which a device or a pattern is formed) facing upward. The plate 18 is, for example, a rectangular shape or a square shape. The area of the plate 18 is larger than that of the substrate W, and when the substrate W is placed at a predetermined position on the plate 18 and the plate 18 is viewed from directly below, the substrate W is completely covered by the plate 18.

The tray 14 can be moved in a horizontal direction between a processing position (closed position) and a substrate delivery position (opened position) by a tray movement mechanism (not shown). At the processing position, the plate 18 is located in the internal space of the process container 12, and the lid 16 closes the opening in the side wall of the process container 12 (state shown in FIG. 1). At the substrate delivery position, the plate 18 is located outside the process container 12, and therefore, the substrate W can be delivered between the plate 18 and a substrate transfer arm (not shown). A movement direction of the tray 14 is, for example, the horizontal direction in FIG. 1. The movement direction of the tray 14 may be a direction perpendicular to the paper surface of FIG. 1, in which case, the lid 16 can be provided on the back side or the front side of the plate 18 in the figure.

When the tray 14 is at the processing position, the internal space of the process container 12 is divided by the plate 18 into an upper space 12A above the plate 18 in which the substrate W is present during processing, and a lower space 12B below the plate 18. However, the upper space 12A and the lower space 12B are not completely separated. A gap is formed between a peripheral edge of the tray 14 at the processing position and an inner wall surface of the process container 12 to form a communication passage via which the upper space 12A and the lower space 12B are in communication with each other. Further, in the vicinity of the lid 16, a through-hole via which the upper space 12A and the lower space 12B are in communication with each other may be provided in the plate 18.

As described above, when the internal space of the process container 12 is divided into the upper space 12A and the lower space 12B and the communication passage via which the upper space 12A and the lower space 12B are in communication with each other is provided, the tray 14 (the plate 18) may be configured as a substrate mounting table (substrate holder) fixed in the process container 12 so as not to be movable. In this case, in a state where a lid (not shown) provided in the process container 12 is opened, the substrate transfer arm (not shown) enters a container body to deliver the substrate W between the substrate mounting table and the substrate transfer arm.

The process container 12 has a first discharge part 21 and a second discharge part 22 for discharging a process fluid (here, carbon dioxide (also referred to as "$CO_2$" for the sake of convenience)), which is supplied from a source 30 of a supercritical fluid (process fluid in a supercritical state), into the internal space of the process container 12.

The first discharge part 21 is provided below the plate 18 of the tray 14 at the processing position. The first discharge part 21 discharges $CO_2$ into the lower space 12B toward a lower surface of the plate 18. The first discharge part 21 can be configured by a through-hole formed in a bottom wall of the process container 12. The first discharge part 21 may be a nozzle body attached to the bottom wall of the process container 12.

The second discharge part 22 is provided so as to be located on a lateral side of the substrate W placed on the plate 18 of the tray 14 at the processing position. The second discharge part 22 can be provided, for example, on or near one side wall (first side wall) of the process container 12. The second discharge part 22 supplies $CO_2$ into the upper space 12A toward a region slightly above the surface of the substrate W. It is desirable that the second discharge part 22 is configured so as to flow $CO_2$ along an upper surface (front surface) of the substrate W substantially evenly over the entire diameter of the substrate W in the region above the substrate W. A specific configuration example of the second discharge part 22 will be described later.

The process container 12 further has a fluid discharge part 24 for discharging the process fluid from the internal space of the process container 12. Like the second discharge part 22, the fluid discharge part 24 can be formed as a header formed of a horizontally extending pipe-shaped member having a plurality of holes. The fluid discharge part 24 can be provided, for example, on or near a side wall (second side wall) opposite to the first side wall of the process container 12 in which the second discharge part 22 is provided.

The fluid discharge part 24 can be disposed at any position at which $CO_2$ supplied from the second discharge part 22 into the process container 12 is discharged from the fluid discharge part 24 after passing through the region above the substrate W on the plate 18. That is, for example, the fluid discharge part 24 may be provided at the bottom of the process container 12 near the second side wall. In this case, $CO_2$ flows through the region above the substrate W in the upper space 12A, flows into the lower space 12B through the communication passage provided at the peripheral edge of the plate 18 (or the through-hole formed in the plate 18), and then is discharged from the fluid discharge part 24.

Next, in the supercritical drying apparatus, a supply/discharge system for supplying and discharging $CO_2$ into and from the process container 12 will be described. In a piping system diagram shown in FIG. 1, a member denoted by T in a circle is a temperature sensor, and a member denoted by P in a circle is a pressure sensor. A member with a symbol OLF is an orifice (a fixed throttle), which reduces a pressure of $CO_2$ flowing in a pipe on a downstream side thereof to a desired value. A member denoted by SV in a rectangle is a safety valve (relief valve), which prevents components of the supercritical drying apparatus, such as pipes or the process container 12, from being damaged by an unexpected excessive pressure. A member with a symbol F is a filter, which removes contaminants such as particles contained in $CO_2$. A member with a symbol CV is a check valve (non-return valve). A member denoted by FV in a circle is a flowmeter (flow rate meter). A member denoted by H in a rectangle is a heater for regulating a temperature of $CO_2$. When it is necessary to distinguish an individual object having the above-mentioned various members from another individual object, a number is added to the end of the alphabet (for example, "filter F2"). A member denoted by a symbol VN (N is a natural number) is an opening/closing valve, and ten opening/closing valves V1 to V10 are shown in FIG. 1.

The supercritical drying apparatus has a supercritical fluid supply device 30 as the source 30 of the supercritical fluid (supercritical $CO_2$). The supercritical fluid supply device 30 has a well-known configuration including, for example, a carbon dioxide gas cylinder, a pressurizing pump, a heater, and the like. The supercritical fluid supply device 30 has an ability to send out the supercritical $CO_2$ at a pressure exceeding a supercritical state guarantee pressure (specifically, about 16 MPa) to be described later.

A main supply line 32 is connected to the supercritical fluid supply device 30. $CO_2$ flows out in a supercritical state from the supercritical fluid supply device 30 to the main supply line 32, but it may also be in a gas state due to subsequent expansion or temperature change. In the present disclosure, a member called "line" can be configured by a pipe (piping member).

The main supply line 32 branches into a first supply line (first branch supply line) 34 and a second supply line (second branch supply line) 36 at a branch point (first branch point) 33. The first supply line 34 is connected to the first discharge part 21 of the process container 12. The second supply line 36 is connected to the second discharge part 22 of the process container 12.

A discharge line 38 is connected to the fluid discharge part 24 of the process container 12. A pressure adjusting valve 40 is provided in the discharge line 38. By regulating an opening degree of a pressure adjusting valve 40, the primary side pressure of the pressure adjusting valve 40 can be regulated, and therefore, the internal pressure of the process container 12 can be regulated. Further, by regulating the opening degree of the pressure adjusting valve 40, a speed of discharging the process fluid from the process container 12 can also be regulated.

A controller 100 schematically shown in FIG. 1 feedback-controls the opening degree of the pressure adjusting valve 40 (specifically, a position of a valve body) so that the internal pressure of the process container 12 is maintained at a set value (SV), based on a deviation between a measured value (PV) and the set value of the internal pressure of the process container 12. As the measured value of the internal pressure of the process container 12, for example, as shown in FIG. 1, a detected value of the pressure sensor having a symbol PS provided between an opening/closing valve V3 of the discharge line 38 and the process container 12 can be used. That is, the internal pressure of the process container 12 may be measured directly by a pressure sensor provided inside the process container 12, or may be measured indirectly by the pressure sensor PS provided outside the process container 12 (in the discharge line 38). The pressure adjusting valve 40 can be set to a fixed opening degree (without feedback control) based on a command value from the controller 100.

The controller 100 is, for example, a computer, and includes an operation part 101 and a storage part 102. The storage part 102 stores programs that control various processes to be executed in the supercritical drying apparatus (or a substrate processing system including the supercritical drying apparatus). The operation part 101 controls operations of the supercritical drying apparatus by reading and executing the programs stored in the storage part 102. The programs, which have been recorded on a non-transitory computer-readable storage medium, may be installed from a storage medium in the storage part 102 of the controller 100. Examples of the non-transitory computer-readable storage medium may include a hard disk (HD), a flexible disk (FD), a compact disc (CD), a magnet optical disc (MO), a memory card, and the like.

At a branch point 42 set on the first supply line 34, a bypass line 44 branches from the first supply line 34. The bypass line 44 is connected to the discharge line 38 at a connection point (joining point) 46 set in the discharge line 38. The connection point 46 is on an upstream side of the pressure adjusting valve 40.

At a branch point 48 set in the discharge line 38 on the upstream side of the pressure adjusting valve 40, a branch discharge line 50 branches from the discharge line 38. A downstream end of the branch discharge line 50 is, for example, opened to the air space outside the supercritical drying apparatus or is connected to a factory exhaust duct.

At a branch point 52 set in the discharge line 38, two branch discharge lines 54 and 56 branch from the discharge line 38. Downstream ends of the branch discharge lines 54 and 56 rejoin the discharge line 38. A downstream end of the discharge line 38 is connected to, for example, a fluid recovery device (not shown). A useful component (for example, isopropyl alcohol (IPA)) contained in $CO_2$ recovered by the fluid recovery device is appropriately separated and reused. As shown in FIG. 1, the downstream end of the branch discharge line 50 may be joined with the discharge line 38.

A purge gas supply line 62 is connected to a joining point 60 set in the first supply line 34 between the branch point 42 and the process container 12. A purge gas can be supplied into the process container 12 via the purge gas supply line 62.

A discharge line 66 for discharging the process fluid branches from a branch point (second branch point) 64 set in the main supply line 32 on an immediate upstream side of the branch point (first branch point) 33. The discharge line 66 will be hereinafter referred to as a "pressure relief line 66" in order to distinguish it from the discharge line 38.

Figure 2A:
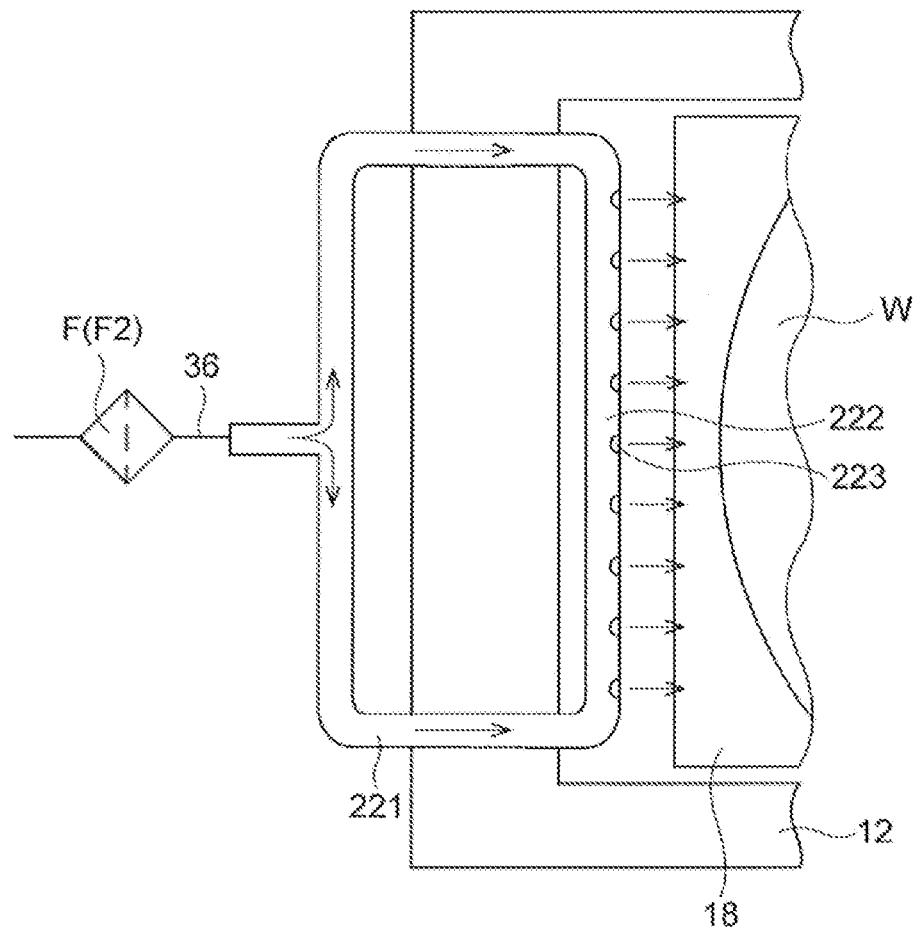
FIG. 2A is a schematic view showing an example of a specific configuration of a second discharge part when viewed from above.
Figure 2B:
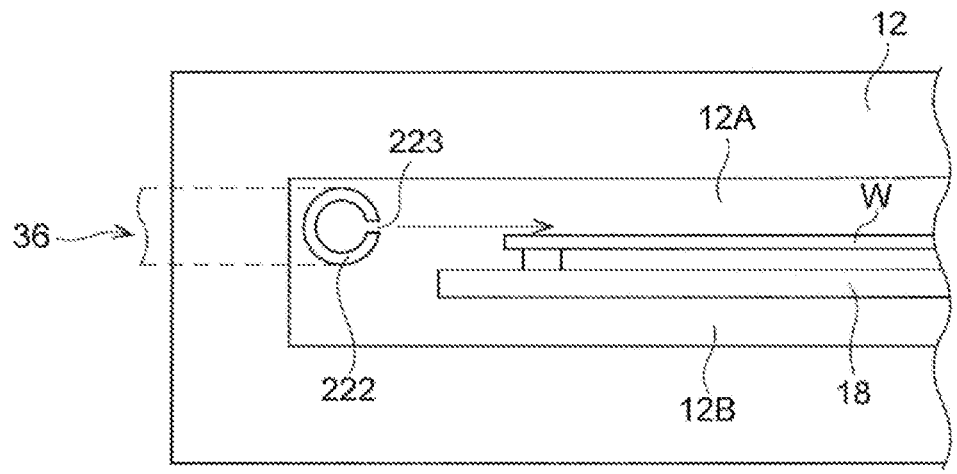
FIG. 2B is a schematic view showing an example of a specific configuration of the second discharge part when viewed from side.

An example of the configuration of the second discharge part 22 will be described with reference to FIGS. 2A and 2B. The second discharge part 22 has a pipe-shaped member 221 connected to the second supply line 36. The pipe-shaped member 221 has a discharge region 222 exposed in the internal space (particularly, the upper space 12A) of the process container 12. A plurality of discharge ports 223 is formed in the discharge region 222 of the pipe-shaped member 221. The second supply line 36 bifurcates to be connected to both ends of the discharge region 222. $CO_2$ supplied from the second supply line 36 flows as indicated by an arrow in the figure and is supplied from the discharge ports 223 into the process container 12. The configuration of the second discharge part 22 is not limited to that shown in FIGS. 2A and 2B.

Next, an example of a supercritical drying method (substrate processing method) using the above-described supercritical drying apparatus will be described with reference to FIGS. 3A to 3F. A procedure described below is automatically executed under the control of the controller 100 based on a processing recipe and a control program stored in the storage part 102. In FIGS. 3A to 3F, opening/closing valves painted in gray are in a closed state and opening/closing valves not painted in gray are in an opened state.

[Loading Process]

The substrate W such as a semiconductor wafer is placed on the plate 18 of the tray 14, which stands by at the substrate delivery position, by the substrate transfer arm (not shown) in a state where a recess of a pattern on the surface of the wafer W is filled with IPA and a paddle (liquid film) of IPA is formed on the surface. This substrate W has been subjected to (1) a chemical liquid process such as wet etching or chemical cleaning, (2) a rinsing process of washing away the chemical liquid with a rinsing liquid, and (3) an IPA substitution process of forming an IPA paddle (liquid film) by substituting the rinsing liquid with IPA, sequentially, for example, in a single-wafer cleaning apparatus (not shown). When the tray 14 on which the substrate W is placed moves to the processing position, a sealed processing space is formed in the process container 12, and the substrate W is located in the processing space.

[Pressure Increasing Process]

Subsequently, a pressure increasing process is carried out. The pressure increasing process is divided into an initial deceleration pressure increasing stage and a subsequent normal pressure increasing stage, and the normal pressure increasing stage is further divided into a first normal pressure increasing stage using the first supply line 34 and a second normal pressure increasing stage using the second supply line 36.

The opening/closing valves V6, V7, and V8 are always in a closed state from a start point of the pressure increasing process to an end point of a pressure decreasing process (discharging process), and these opening/closing valves are not referred to. The opening/closing valve V8 may always be in a closed state in the pressure increasing process and a circulating process, and may be in an opened state in the pressure decreasing process. The opening/closing valve V8 may always be in a closed state from the start point of the pressure increasing process to the end point of the pressure decreasing process, or may be in an opened state at an appropriate timing if necessary. When the opening/closing valve V8 is in the opened state, exhaust can be performed without passing through the pressure adjusting valve 40, so that the exhaust or depressurization time can be shortened. In the following description, it is assumed that the opening/closing valve V8 is always in the closed state.

<Deceleration Pressure Increasing Stage>

Figure 3A:
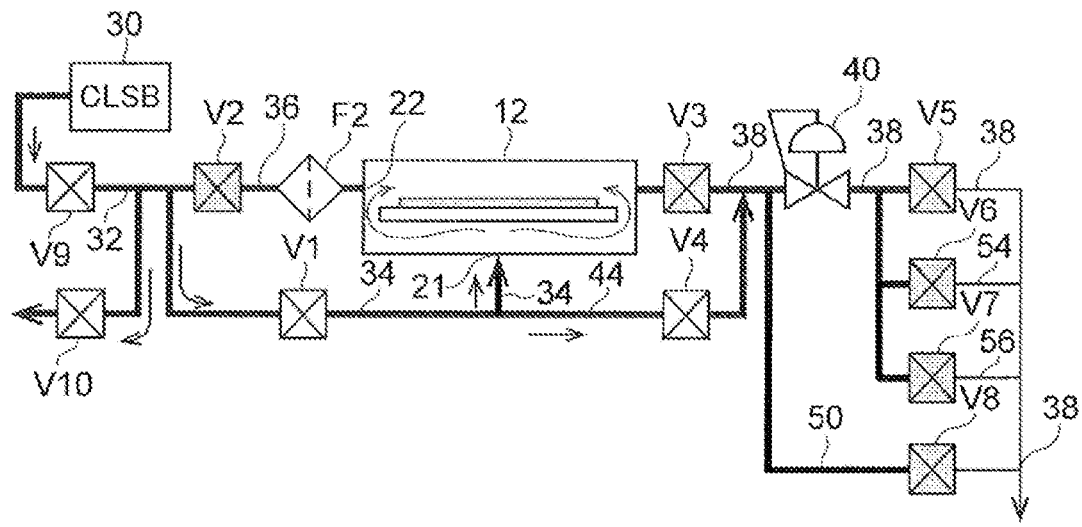
FIG. 3A is an operative diagram showing a series of procedures of a supercritical drying method according to an embodiment.

First, as shown in FIG. 3A, the opening/closing valves V2, V3, V6, and V7 are set to a closed state, and the opening/closing valves V1, V4, V9, and V10 are set to an opened state. In this deceleration pressure increasing stage, an opening degree of the pressure adjusting valve 40 is fixed to an appropriate fixed opening degree, for example, 2.5%, corresponding to an opening degree command value from the controller 100. That is, feedback control of the opening degree of the pressure adjusting valve 40 (for example, control for maintaining the primary pressure of the pressure adjusting valve 40 at a constant level) is not performed. The opening degree of the pressure adjusting valve 40 is maintained at the above-mentioned fixed opening degree until the second normal pressure increasing stage to be described later is completed (however, it may be changed).

Some (for example, about 35%) of $CO_2$ sent out from the supercritical fluid supply device 30 to the main supply line 32 in the supercritical state is discharged from the pressure relief line 66 provided with the orifice OLF, and the rest flows into the first supply line 34. Some (for example, about 35%) of $CO_2$ that flowed into the first supply line 34 flows into the process container 12 via the first discharge part 21. Further, the rest of $CO_2$ that flowed through the first supply line 34 flows into the discharge lines 38 and 50 via the bypass line 44 without going to the process container 12, and is blocked by the opening/closing valves V5 to V8 in the closed state.

At this time, by changing the opening degree of the pressure adjusting valve 40, it is possible to regulate a ratio of a flow rate of $CO_2$ flowing into the process container 12 and a flow rate of $CO_2$ flowing through the bypass line 44.

Immediately after the start of the deceleration pressure increasing stage, a pressure of $CO_2$ sent out from the supercritical fluid supply device 30 in the supercritical state gradually decreases. However, when $CO_2$ flows into the process container 12 having a relatively large volume in the normal pressure state, the pressure of $CO_2$ decreases substantially in particular. That is, at an initial stage of introducing $CO_2$ into the process container 12, since the pressure of $CO_2$ in the process container 12 is lower than a critical pressure (for example, about 8 MPa), $CO_2$ is in a gas state. Since a difference between the internal pressure of the first supply line 34 and the internal pressure of the process container 12 in the normal pressure state is very large, $CO_2$ flows into the process container 12 at a high flow velocity immediately after the start of the deceleration pressure increasing stage. When $CO_2$ (especially, $CO_2$ of a high speed and in a gas state) collides with the substrate W or flows in the vicinity of the substrate W, collapse (local evaporation or fluctuation) of the paddle of IPA at the peripheral edge of the substrate W occurs, which may cause pattern collapse.

In the present embodiment, since the orifice (OLF) is provided in the first supply line 34, the flow velocity of $CO_2$ when flowing into the process container 12 from the first discharge part 21 is lower than that in a case where there is no orifice. Therefore, the pattern collapse due to the above mechanism can be suppressed.

Further, in the present embodiment, $CO_2$ that flowed into the process container 12 from the first discharge part 21 collides with the plate 18 of the tray 14, and then bypasses the plate 18 and enters the upper space 12A where the substrate W exists (see an arrow in FIG. 3A). Therefore, when $CO_2$ in the gas state reaches the vicinity of the substrate W, the flow velocity of $CO_2$ is relatively low. Therefore, the pattern collapse due to the above mechanism can be suppressed.

Even when $CO_2$ bypasses the plate 18 and enters the upper space 12A after colliding with the plate 18, if the flow velocity of $CO_2$ flowing into the process container 12 is high, there is also a possibility that the flow velocity of $CO_2$ at the time when $CO_2$ reaches the vicinity of the peripheral edge of the substrate W is high enough to cause a pattern collapse. However, in the present embodiment, in the deceleration pressure increasing stage, that is, at the initial stage of introducing $CO_2$ into the process container 12, some of $CO_2$ flowing through the main supply line 32 is released to the pressure relief line 66, and further, some of $CO_2$ flowing through the first supply line 34 is released to the bypass line 44. Therefore, the flow velocity of $CO_2$ flowing from the first discharge part 21 into the process container 12 further decreases, so that the pattern collapse due to the above mechanism can be prevented more reliably.

The pattern collapse due to the above mechanism can occur only at the initial stage of introduction of $CO_2$ into the process container 12. This is because as the internal pressure of the process container 12 increases, the flow velocity of $CO_2$ flowing into the process container 12 via the first discharge part 21 decreases. Therefore, it is sufficient to execute the deceleration pressure increasing stage for a relatively short time, for example, about 10 to 20 seconds. As an example, the deceleration pressure increasing stage is carried out for about 20 seconds, whereby the internal pressure of the process container 12 rises from normal pressure to 4 MPa.

Another advantage of providing the deceleration pressure increasing stage is that, for example, it is not necessary to make a diameter of the orifice (OLF) of the first supply line 34 extremely small. This makes it possible to shorten the pressure increasing time when $CO_2$ is supplied from the first supply line 34 into the process container 12.

<First Normal Pressure Increasing Stage (First Pressure Increasing Stage)>

Figure 3B:
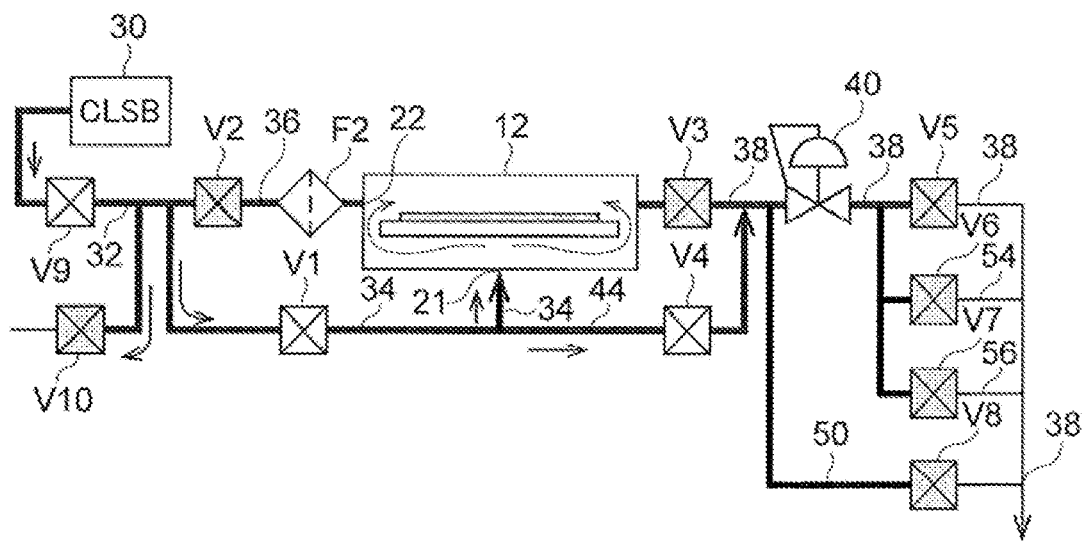
FIG. 3B is an operative diagram showing a series of procedures of a supercritical drying method according to an embodiment.

Subsequently, as shown in FIG. 3B, the opening/closing valve V10 is closed to stop the discharge of $CO_2$ from the main supply line 32 via the pressure relief line 66. The transition from the deceleration pressure increasing stage to the first normal pressure increasing stage may be performed with a lapse of a predetermined time (for example, 20 seconds described above) from the start of the deceleration pressure increasing stage, or may be performed when the internal pressure of the process container 12 reaches a predetermined pressure (for example, 4 MPa described above). The internal pressure of the process container 12 can be detected by, for example, a pressure sensor PS (hereinafter also referred to as a "pressure sensor PS12") provided in the discharge line 38 in the vicinity of the fluid discharge part 24 of the process container 12.

In the first normal pressure increasing stage, the internal pressure of the process container 12 rises at a pressure increasing speed higher than that in the deceleration pressure increasing stage as much as $CO_2$ is not discharged via the pressure relief line 66. Further, internal pressures of the lines 44, 38, 50, 54, and 56 having downstream ends closed by the opening/closing valves V5 to V8, respectively, also rise.

When the internal pressure of the process container 12 exceeds the critical pressure (about 8 MPa) of $CO_2$, $CO_2$ ($CO_2$ not mixed with IPA) existing in the process container 12 becomes a supercritical state. When $CO_2$ in the process container 12 becomes the supercritical state, IPA on the substrate W begins to dissolve in $CO_2$ in the supercritical state.

<Pressure Releasing Stage>

Figure 3C:
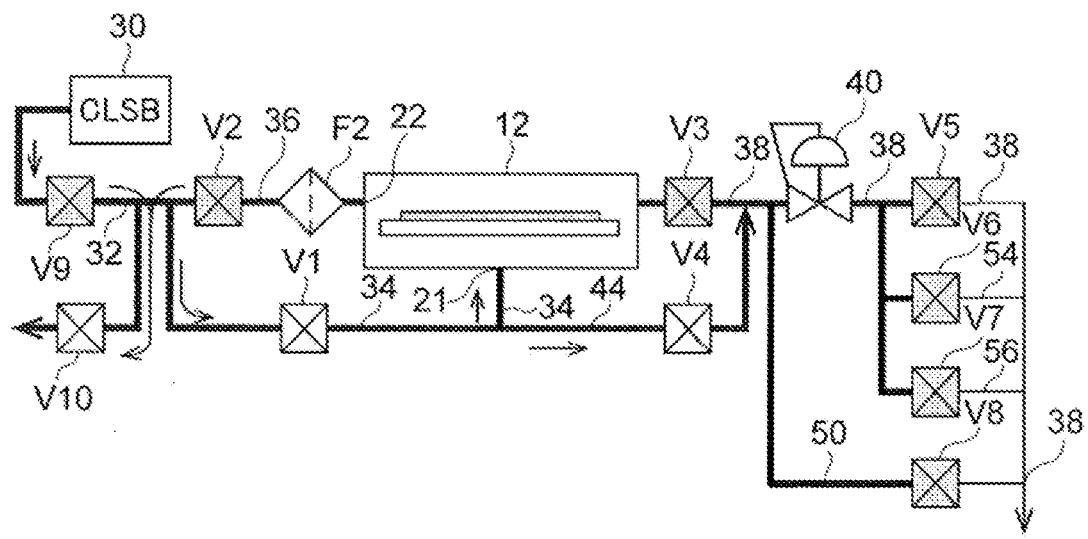
FIG. 3C is an operative diagram showing a series of procedures of a supercritical drying method according to an embodiment.

When a detected value of the pressure sensor PS12 (that is, the internal pressure of the process container 12) reaches a predetermined switching pressure of 13 MPa, the opening/closing valve V9 is set to a closed state and the opening/closing valve V10 is set to an opened state, as shown in FIG. 3C. These states are continued for a short time, for example, 0.5 seconds. As a result, the internal pressure of the second supply line 36 on the upstream side of the opening/closing valve V2 in the closed state and the internal pressure of the main supply line 32 on the immediate upstream side of the branch point 33 are lowered to about 15 MPa.

Immediately before the transition from the first normal pressure increasing stage to the second normal pressure increasing stage, the internal pressure of the second supply line 36 on the upstream side of the opening/closing valve V2 in the closed state and the internal pressure of the main supply line 32 on the immediate upstream side of the branch point 33 are, for example, about 17 MPa, and the internal pressure of the process container 12 is, for example, 13 MPa as described above. On the other hand, a differential pressure resistance of a filter F (also referred to as a "filter F2") provided in the second supply line 36 is, for example, 3 MPa. If the opening/closing valve V2 is suddenly opened from this state, a differential pressure of 4 MPa is loaded to both sides of the filter F2, which may damage the filter F2 (filter element). On the other hand, by executing the pressure releasing stage described above, it is possible to prevent the filter F2 from being damaged when the opening/closing valve V2 is opened. A pressure on the primary side of the opening/closing valve V2 should not be lower than a pressure on the secondary side due to the pressure relief. This is because, when the opening/closing valve V2 is opened, $CO_2$ (which contains IPA including particle-causing substances) flows into the second discharge part 22 from the process container 12.

The reason for avoiding an inflow of $CO_2$ containing IPA into the second discharge part 22 from the process container 12 will be described in detail in the description of the effects of the embodiment at the end of the disclosure.

When performing this pressure releasing stage, the opening/closing valve V1 is left open so that the supply of $CO_2$ into the process container 12 is not stopped. If the supply of $CO_2$ (which has a relatively high temperature) into the process container 12 is stopped, the internal pressure of the process container 12 may temporarily decrease because $CO_2$ in the process container 12 is deprived of heat by the tray 14. The reason is that the tray 14 is exposed to atmospheric atmosphere at room temperature when the substrate W is loaded and unloaded so that the tray 14 has the lowest temperature among the members (the inner wall of the process container, nozzles, etc.) facing the internal space of the process container 12.

A similar problem may occur in a filter F (also referred to as a "filter F1") provided in the first supply line 34 at the start of the deceleration pressure increasing stage. However, for the following reasons, there is no possibility that a differential pressure exceeding a differential pressure resistance of the filter F1 is loaded to the filter F1. (Reason 1) Since the opening/closing valve V9 is in the closed state immediately before the start of the deceleration pressure increasing stage and the orifice OLF is present in the main supply line 32, the internal pressure of the main supply line 32 on the downstream side of the orifice OLF does not increase at once immediately after the opening/closing valve V9 transitions to the opened state. (Reason 2) Since the deceleration pressure increasing stage is performed with the opening/closing valve V10 opened and the orifice OLF is provided in the first supply line 34 on the upstream side of the filter F1, a pressure on the primary side of the filter F1 does not increase sharply.

<Second Normal Pressure Increasing Stage (Second Pressure Increasing Stage)>

Figure 3D:
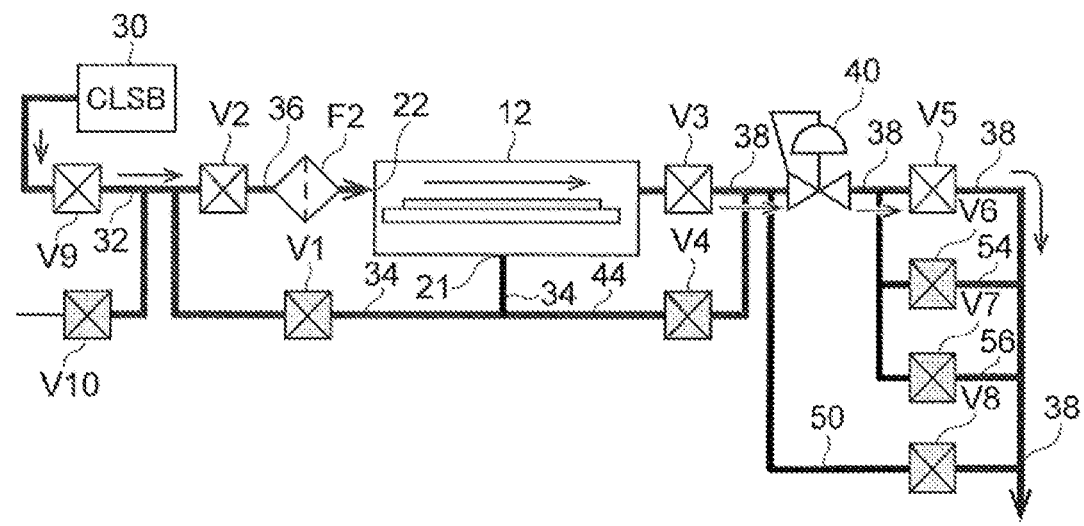
FIG. 3D is an operative diagram showing a series of procedures of a supercritical drying method according to an embodiment.

Immediately after an end of the pressure releasing stage, the opening/closing valves V1, V4, and V10 are set to a closed state and the opening/closing valves V2, V3, and V5 are set to an opened state, as shown in FIG. 3D. Then, $CO_2$ that flowed through the main supply line 32 flows into the process container 12 via the second supply line 36 and the second discharge part 22. $CO_2$ no longer flows into the process container 12 via the first supply line 34 and the first discharge part 21. By discharging $CO_2$ from the second discharge part 22 as soon as possible in this way, an amount of $CO_2$ (which contains IPA including particle-causing substances) flowing into the second discharge part 22 from the process container 12 can be decreased at least substantially (details of which will be described later).

Since the opening/closing valves V3 and V5 are in an opened state in the second normal pressure increasing stage, some of $CO_2$ that flowed into the process container 12 is discharged from the discharge line 38. $CO_2$ discharged from the discharge line 38 contains IPA that was on the surface of the substrate W. At this time, since the opening degree of the pressure adjusting valve 40 is as small as, for example, about 2.5%, the flow rate of $CO_2$ discharged from the process container 12 via the discharge line 38 is relatively small. Therefore, the internal pressure of the process container 12 continues to rise. By increasing the internal pressure of the process container 12 while discharging $CO_2$ from the process container 12 in this way, it is possible to prevent particles and particle-causing substances existing in the process container 12 from remaining in the process container 12 and contaminating the substrate W.

Immediately before a start of the second normal pressure increasing stage, since the internal pressures of the lines 44, 38, 50, 54, and 56 are almost equal to the internal pressure of the process container 12 (because the opening/closing valves V5 to V8 are in the closed state), the internal pressure of the process container 12 does not drop sharply immediately after switching the opening/closing valves V3 and V5 to the opened state. If the internal pressure of the process container 12 drops sharply, a pattern may collapse or the number of particles may increase due to a phase change of $CO_2$. That is, releasing $CO_2$ to the bypass line has two effects of not only reducing the inflow rate of $CO_2$ into the process container 12 at the deceleration pressure increasing stage but also preventing the internal pressure of the process container 12 from dropping sharply at the start of the second normal pressure increasing stage.

The second normal pressure increasing stage continues until the internal pressure of the process container 12 reaches a pressure at which it is guaranteed that a fluid mixture ($CO_2$+IPA) is maintained at a supercritical state (supercritical state guarantee pressure) regardless of an IPA concentration of the fluid mixture on the substrate W and a temperature of the fluid mixture. The supercritical state guarantee pressure is about 16 MPa. When the internal pressure of the process container 12 reaches the above-mentioned supercritical state guarantee pressure, a pattern collapse due to a local phase change (for example, vaporization) of the fluid mixture in the plane of the substrate W no longer occurs. Such a local phase change occurs due to non-uniformity of the IPA concentration in the fluid mixture in the plane of the substrate W, and may occur particularly in a region exhibiting an IPA concentration at which the critical temperature becomes high.

<Circulating Process>

When it is detected by the pressure sensor PS12 that the internal pressure of the process container 12 has reached the supercritical state guarantee pressure (16 MPa), an operation mode of the pressure adjusting valve 40 is switched to a feedback control mode. That is, the controller 100 (or its lower level controller) executes feedback control to adjust the opening degree (manipulated variable (MV)) of the pressure adjusting valve 40 based on a deviation between the internal pressure of the process container 12 (a measured value PV) detected by the pressure sensor PS12 and a set value (SV=16 MPa) so that the internal pressure of the process container 12 is maintained at the set value SV. At this time, the opening degree of the pressure adjusting valve 40 fluctuates within a range of, for example, 30 to 50%.

Further, in performing the feedback control of the pressure adjusting valve 40, the controller 100 may transmit a command to the pressure adjusting valve 40 so that an initial opening degree, which is the opening degree at the start of the feedback control of the pressure adjusting valve 40, is set to, for example, an average opening degree of the pressure adjusting valve 40 of circulating processes executed in the past. By doing so, the fluctuation of the internal pressure of the process container 12 at the start of the feedback control can be suppressed, thereby making the feedback control stable.

The opened/closed state of each opening/closing valve in the circulating process is the same as that of the second normal pressure increasing stage shown in FIG. 3D, and only the control form and opening degree of the pressure adjusting valve 40 are different.

In the circulating process, the supercritical $CO_2$ supplied from the second discharge part 22 into the process container 12 flows in an upper region of the substrate and then is discharged from the fluid discharge part 24. At this time, a laminar flow of supercritical $CO_2$ flowing substantially in parallel to the front surface of the substrate W is formed in the process container 12. IPA in the fluid mixture (IPA+$CO_2$) on the front surface of the substrate W exposed to the laminar flow of supercritical $CO_2$ is replaced by the supercritical $CO_2$. Eventually, almost all of IPA on the front surface of the substrate W is replaced with the supercritical $CO_2$.

The fluid mixture composed of IPA and the supercritical $CO_2$ discharged from the fluid discharge part 24 is recovered after flowing through the discharge line 38 (and the branch discharge lines 54 and 56). IPA included in the fluid mixture can be separated and reused. Further, in the circulating process, the opening/closing valves V6 and V7 may be in an opened state or a closed state depending on a desired flow rate or the like.

[Discharging Process]

Figure 3E:
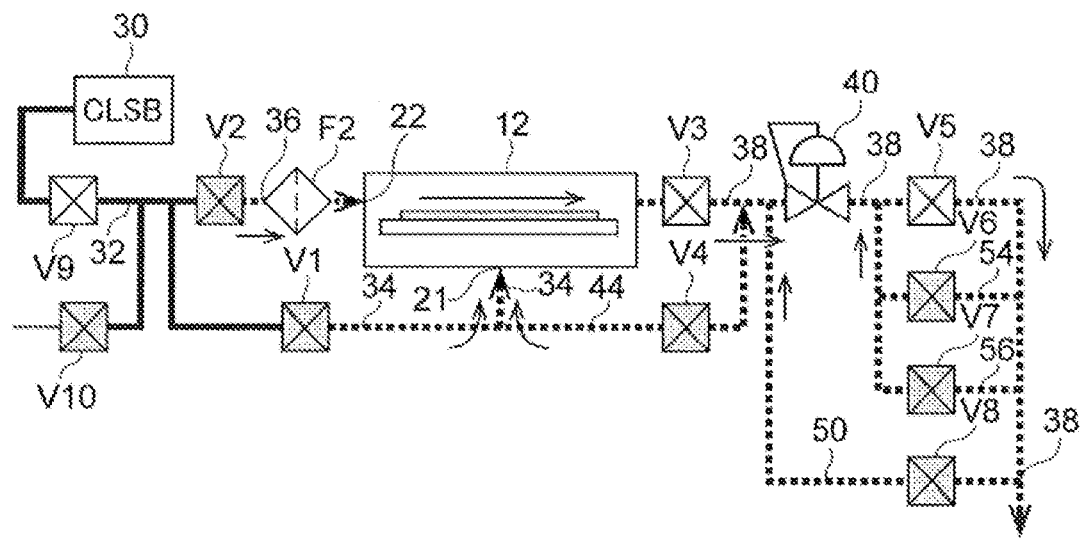
FIG. 3E is an operative diagram showing a series of procedures of a supercritical drying method according to an embodiment.
Figure 3F:
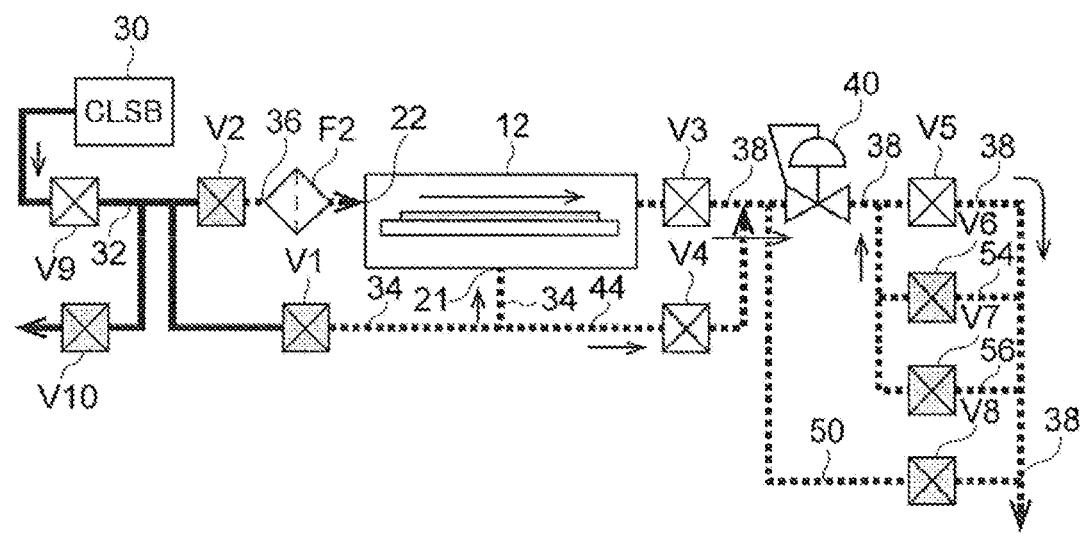
FIG. 3F is an operative diagram showing a series of procedures of a supercritical drying method according to an embodiment.

When the replacement of IPA with the supercritical $CO_2$ is completed, as shown in FIG. 3E, the opening/closing valve V2 is closed to stop the supply of $CO_2$ into the process container 12, and the set pressure of the process container 12 is lowered to the normal pressure. As a result, the opening degree of the pressure adjusting valve 40 becomes substantially large (for example, fully opened), and thus the internal pressure of the process container 12 decreases to the normal pressure. Thus, the supercritical $CO_2$ in the pattern of the substrate W becomes a gas and is separated from the pattern, and $CO_2$ in the gas state is discharged from the process container 12. Finally, as shown in FIG. 3F, the opening/closing valve V4 of the bypass line 44 is opened to release $CO_2$ remaining between the opening/closing valve V1 and the opening/closing valve V4. This completes the drying of the substrate W.

[Unloading Process]

The plate 18 of the tray 14 on which the dried substrate W is placed comes out of the process container 12 and moves to the substrate delivery position. The substrate W is taken out from the plate 18 by the substrate transfer arm (not shown) and is accommodated in, for example, a substrate process container (not shown).

According to the embodiment described above, the following advantageous effects are achieved.

The following is assumed as a comparative example. In the entire pressure increasing process of increasing the internal pressure of the process container 12 from the normal pressure to the supercritical state guarantee pressure (16 MPa), when $CO_2$ is supplied from the first discharge part 21 into the process container 12 and the internal pressure of the process container 12 reaches the supercritical state guarantee pressure, it is assumed that a $CO_2$ supply route to the process container 12 is switched from the first supply line 34 (the first discharge part 21) to the second supply line 36 (the second discharge part 22) to execute the circulating process (hereinafter, in the present disclosure, for the sake of brevity of description, the above switching is also simply referred to as "supply route switching"). By doing so, the following events may occur. That is, most of IPA paddle on the substrate W diffuses into $CO_2$ until the internal pressure of the process container 12 rises from 7 MPa to 14 MPa. The diffused IPA includes particle-causing substances (particle-causing substances originally dissolved in the IPA, or particle-causing substances derived from deposits peeled off from the inner wall of the process container 12 or the surface of the tray 14). Thereafter, until the internal pressure of the process container 12 rises to 16 MPa, $CO_2$ including IPA is pushed into the second discharge part 22 (for example, the pipe-shaped member 221) and further pushed into the pipe on an upstream side thereof (a downstream side of the filter F2). The IPA pushed into the second discharge part 22 and further pushed into the pipe is injected from the second discharge part 22 when $CO_2$ is supplied from the second discharge part 22 into the process container 12, and contaminates the substrate W. In this case, it has been confirmed that particle contamination is concentrated on a portion of the substrate W near the second discharge part 22.

In contrast, according to the above embodiment, before the internal pressure of the process container 12 reaches the supercritical state guarantee pressure (when it reaches 13 MPa in the above embodiment), the $CO_2$ supply route to the process container 12 is switched from the first discharge part 21 to the second discharge part 22. As a result, $CO_2$ including IPA is substantially suppressed from being pushed into the second discharge part 22.

When the internal pressure of the process container 12 exceeds the critical pressure (about 8 MPa) of $CO_2$, diffusion of IPA into the process container 12 starts. Therefore, it is considered desirable to perform the supply route switching at this timing. However, it has also been confirmed by experiments that problems occur even when the timing of the supply route switching is set too early. Specifically, according to the inventor's experiments, as a result of switching the supply route when the internal pressure of the process container 12 was 8 MPa and 11 MPa, respectively, a large amount of particles to the extent of not being able to be quantified adhered to the substrate. The inventor considers the reason as follows. When $CO_2$ flows along the front surface of the substrate by discharging $CO_2$ from the second discharge part 22 while the IPA paddle remains on the front surface of the substrate, the IPA paddle is peeled off by the flow of $CO_2$, and at this time, peeling charge is generated. It is considered that by this peeling charge, particles floating in the process container 12 or particles contained in $CO_2$ discharged from the second discharge part 22 are adsorbed on the substrate. Since it is considered that the problem of peeling discharge is also related to $CO_2$ discharge conditions (a discharge direction, a discharge flow velocity, etc.) from the second discharge part 22, it is considered that depending on the discharge conditions, it may not be necessary to increase a switching pressure for performing the supply route switching to about 13 MPa, as in the above embodiment. Further, if the above-mentioned problem of peeling charge can be solved by releasing electric charges by some means, it is conceivable to set the switching pressure to the critical pressure (about 8 MPa) of $CO_2$. Even in the configuration of FIG. 4 to be described later, since $CO_2$ discharged from a second discharge part 22M collides with the front surface of the substrate and then flows along the front surface of the substrate, the peeling charge may occur depending on the discharge conditions.

From the viewpoint of preventing the peeling charge, the inventor considers that it is most desirable to perform the supply route switching immediately after the IPA paddle completely disappears from the front surface of the substrate. In actually performing supercritical drying on a substrate (semiconductor wafer) having an IPA paddle of 12 mL formed on the front surface of the substrate, the supply route switching was performed at timings when the internal pressure of the process container 12 reached 12 MPa, 13 MPa, and 14 MPa, respectively. At this time, the number of particles having a size of 20 nm or more was 224 at 12 MPa, 144 at 13 MPa, and 189 at 14 MPa. That is, the number of particles was the smallest when the supply route switching was performed at 13 MPa. In another experiment, observation with a supercritical monitor (a device that visualizes a situation inside the process container 12) revealed that the IPA paddle disappeared when the internal pressure of the process container 12 reached 13.4 MPa, which is substantially in line with the inference that it is desirable to perform the supply route switching immediately after the IPA paddle has completely disappeared from the front surface of the substrate. However, since the above experimental results may change slightly when a specific device configuration, an amount of IPA paddle, and the like change, it is not thought that the supply route switching should be performed when the internal pressure of the process container 12 reaches exactly 13 MPa.

To summarize what has been described so far, it can be said to be desirable to perform the supply route switching with the internal pressure of the process container 12 that is equal to or higher than the critical pressure of $CO_2$ and lower than the supercritical state guarantee pressure (16 MPa), (in some embodiments, at a pressure close to the pressure at which IPA on the substrate disappears).

Further, it may be considered that a similar event (entry of $CO_2$ mixed with particles) occurs in the first discharge part 21 (which may adversely affect processing of a subsequent substrate). However, as can be understood by comparing and referring to FIGS. 3C and 3D, since the opening/closing valves V1 and V4 are closed in a state where the internal pressures of the first discharge part 21 and the first supply line 34 and the bypass line 44, which are connected to the first discharge part 21, rise, IPA does not enter or hardly enters the first discharge part 21.

The embodiments disclosed this time should be considered to be exemplary in all respects, and not restrictive. The above embodiments may be partially omitted, replaced, or changed in various forms without departing from the accompanying claims and the gist thereof.

Figure 4:
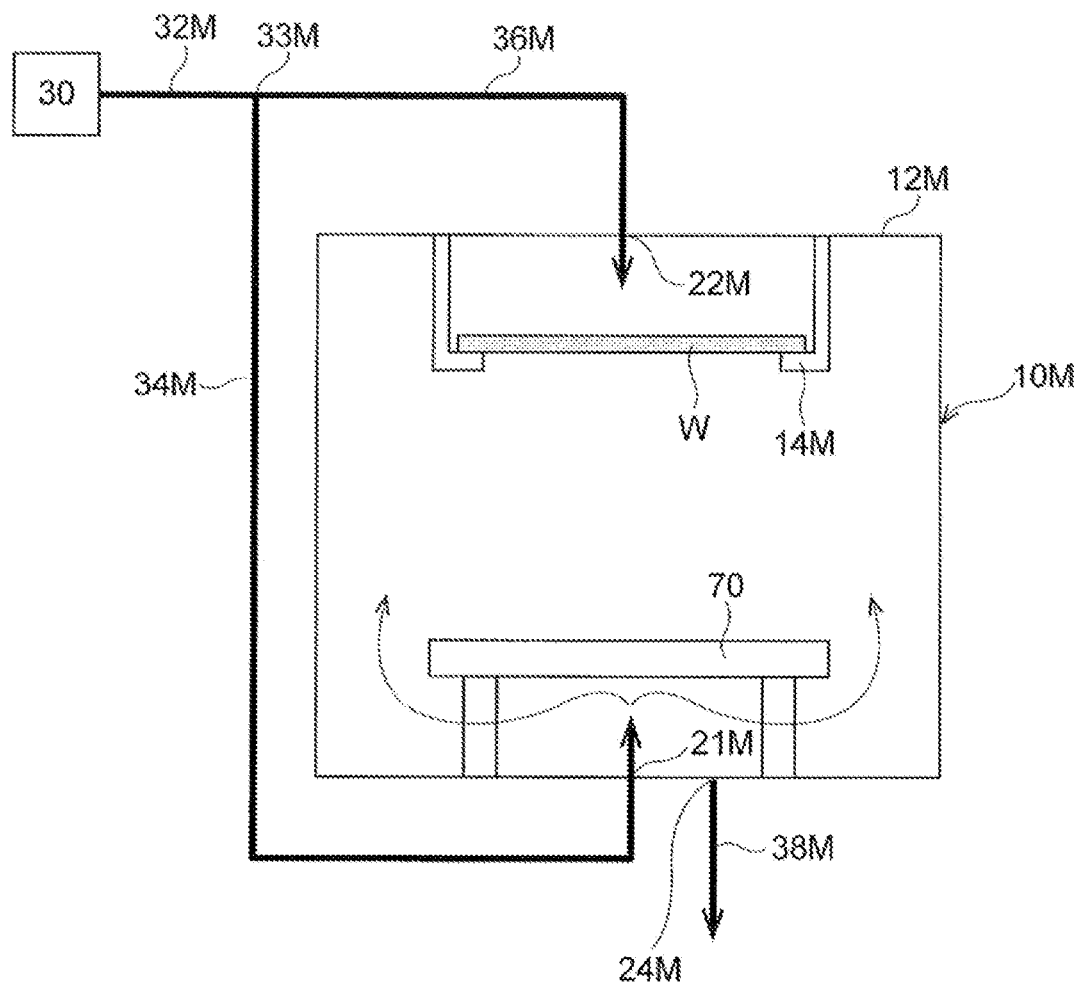
FIG. 4 is a schematic view of a supercritical drying apparatus according to a modified embodiment.

For example, the configuration of the process unit 10 is not limited to that shown in FIG. 1, but may be a process unit 10M schematically shown in FIG. 4. Members having the same reference numerals in numeric portions in FIGS. 1 and 4 mean having substantially the same roles. In a modified embodiment of FIG. 4, a substrate W is supported by a substrate support member 14M attached to a ceiling of a process container 12M. For example, an IPA liquid film is formed on an upper surface of the substrate W. A main supply line 32M connected to the supercritical fluid supply device 30 branches into a first supply line 34M and a second supply line 36M. A process fluid ($CO_2$) discharged from the first discharge part 21 connected to the first supply line 34M collides with a shielding plate 70, bypasses the shielding plate 70, and then flows toward the substrate W. The second discharge part 22M connected to the second supply line 36M discharges the process fluid toward the upper surface of the substrate W. $CO_2$ in the process container 12M can be discharged from a fluid discharge part 24M to a discharge line 38M. Members (various valves, filters, various sensors, etc.) of which details are not shown in FIG. 4 can be disposed in the same manner as in FIG. 1. The process unit 10M shown in FIG. 4 can be used to perform the same procedure as in the above-described embodiments.

According to the present disclosure in some embodiments, it is possible to reduce an amount of particles generated on a substrate when a process fluid in a supercritical state is used to dry the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method performed by using a substrate processing apparatus,
   wherein the substrate processing apparatus comprises:
      a process container in which a substrate is accommodated;
      a substrate holder configured to hold the substrate horizontally in the process container in a state where a front surface of the substrate on which a liquid film is formed faces upward;
      a main supply line connected to a process fluid supply part that supplies a process fluid in a supercritical state;
      a first branch supply line and a second branch supply line that branch from the main supply line at a first branch point set in the main supply line;
      a first discharge part connected to the first branch supply line and configured to discharge the process fluid, which is sent from the first branch supply line, toward a space in the process container below the substrate held by the substrate holder;
      a second discharge part connected to the second branch supply line and configured to discharge the process fluid, which is sent from the second branch supply line, toward a space in the process container above the front surface of the substrate;
      a fluid discharge part configured to discharge the process fluid from the process container;
      a discharge line connected to the fluid discharge part; and
      an opening degree adjustable valve provided in the discharge line,
   wherein the substrate processing method comprises:
      a pressure increasing process of increasing an internal pressure of the process container to a predetermined processing pressure by supplying the process fluid into the process container in a state where the substrate on which the liquid film is formed is held by the substrate holder and is accommodated in the process container; and
      after the pressure increasing process, a circulating process of supplying the process fluid from the second discharge part into the process container and discharging the process fluid in the process container from the fluid discharge part, while maintaining the internal pressure of the process container at the processing pressure,
   wherein the pressure increasing process includes:
      a first pressure increasing stage of increasing the internal pressure of the process container to a predetermined switching pressure by supplying the process fluid from the first discharge part into the process container; and
      after the first pressure increasing stage, a second pressure increasing stage of increasing the internal pressure of the process container from the switching pressure to the processing pressure by supplying the process fluid from the second discharge part into the process container,
   wherein the second pressure increasing stage in the pressure increasing process is performed while discharging the process fluid from the process container to the discharge line, and includes regulating an opening degree of the opening degree adjustable valve so that an inflow amount of the process fluid from the second branch supply line to the process container becomes larger than a discharge amount of the process fluid from the process container to the discharge line, and
   wherein the opening degree of the opening degree adjustable valve during the circulating process is larger than the opening degree of the opening degree adjustable valve during the second pressure increasing stage in the pressure increasing process.

2. The substrate processing method of claim 1, wherein the processing pressure is equal to or higher than a supercritical state guarantee pressure which guarantees a fluid mixture of a liquid forming the liquid film and the process fluid to be maintained at a supercritical state regardless of a temperature of the fluid mixture and a mixing ratio of the liquid forming the liquid film and the process fluid.

3. The substrate processing method of claim 2, wherein the process fluid is carbon dioxide, the liquid is isopropyl alcohol (IPA), and the supercritical state guarantee pressure is 16 MPa.

4. The substrate processing method of claim 3, wherein the switching pressure is 11 MPa or more.

5. The substrate processing method of claim 4, wherein an opening/closing valve that is opened in the second pressure increasing stage and the circulating process and a filter that is provided between the opening/closing valve and the second discharge part are provided in the second branch supply line,
   wherein the pressure increasing process further includes a pressure releasing stage between the first pressure increasing stage and the second pressure increasing stage, and
   wherein the pressure releasing stage includes discharging the process fluid from the second branch supply line and the main supply line on an upstream side of the opening/closing valve, so that a primary side pressure of the opening/closing valve is set to be higher than the internal pressure of the process container in the pressure releasing stage, and so that a difference between the internal pressure of the process container in the pressure releasing stage and the primary side pressure of the opening/closing valve is set to be equal to or lower than a differential pressure resistance of the filter.

6. The substrate processing method of claim 5, wherein a first opening/closing valve is provided in the first branch supply line,
wherein the opening/closing valve provided in the second branch supply line is a second opening/closing valve,
wherein a pressure relief line, which branches from the main supply line at a second branch point set to the main supply line on an upstream side of the first branch point and in which a third opening/closing valve is provided,
wherein a fourth opening/closing valve is provided in the main supply line on an upstream side of the second branch point,
wherein in the first pressure increasing stage, the first opening/closing valve and the fourth opening/closing valve are in an opened state, and the second opening/closing valve and the third opening/closing valve are in a closed state,
wherein in the second pressure increasing stage, the second opening/closing valve and the fourth opening/closing valve are in an opened state, and the first opening/closing valve and the third opening/closing valve are in a closed state, and
wherein in the pressure releasing stage, the first opening/closing valve and the third opening/closing valve are in an opened state, and the second opening/closing valve and the fourth opening/closing valve are in a closed state.

7. The substrate processing method of claim 6, wherein in the first pressure increasing stage, the process fluid is not supplied from the second discharge part into the process container, and in the second pressure increasing stage and the circulating process, the process fluid is not supplied from the first discharge part into the process container.

8. The substrate processing method of claim 7, wherein the second discharge part is formed of a tubular body having a plurality of holes formed in the tubular body.

9. A substrate processing method performed by using a substrate processing apparatus,
wherein the substrate processing apparatus comprises:
a process container in which a substrate is accommodated;
a substrate holder configured to hold the substrate horizontally in the process container in a state where a front surface of the substrate on which a liquid film is formed faces upward;
a main supply line connected to a process fluid supply part that supplies a process fluid in a supercritical state;
a first branch supply line and a second branch supply line that branch from the main supply line at a first branch point set in the main supply line;
a first discharge part connected to the first branch supply line and configured to discharge the process fluid, which is sent from the first branch supply line, toward a space in the process container below the substrate held by the substrate holder;
a second discharge part connected to the second branch supply line and configured to discharge the process fluid, which is sent from the second branch supply line, toward a space in the process container above the front surface of the substrate;
a fluid discharge part configured to discharge the process fluid from the process container; and
a discharge line connected to the fluid discharge part,
wherein the substrate processing method comprises:
a pressure increasing process of increasing an internal pressure of the process container to a predetermined processing pressure by supplying the process fluid into the process container in a state where the substrate on which the liquid film is formed is held by the substrate holder and is accommodated in the process container; and
after the pressure increasing process, a circulating process of supplying the process fluid from the second discharge part into the process container and discharging the process fluid in the process container from the fluid discharge part, while maintaining the internal pressure of the process container at the processing pressure,
wherein the pressure increasing process includes:
a first pressure increasing stage of increasing the internal pressure of the process container to a predetermined switching pressure by supplying the process fluid from the first discharge part into the process container; and
after the first pressure increasing stage, a second pressure increasing stage of increasing the internal pressure of the process container from the switching pressure to the processing pressure by supplying the process fluid from the second discharge part into the process container,
wherein an opening/closing valve that is opened in the second pressure increasing stage and the circulating process and a filter that is provided between the opening/closing valve and the second discharge part are provided in the second branch supply line,
wherein the pressure increasing process further includes a pressure releasing stage between the first pressure increasing stage and the second pressure increasing stage, and
wherein the pressure releasing stage includes discharging the process fluid from the second branch supply line and the main supply line on an upstream side of the opening/closing valve, so that a primary side pressure of the opening/closing valve is set to be higher than the internal pressure of the process container in the pressure releasing stage, and so that a difference between the internal pressure of the process container in the pressure releasing stage and the primary side pressure of the opening/closing valve is set to be equal to or lower than a differential pressure resistance of the filter.

10. The substrate processing method of claim 9, wherein in the first pressure increasing stage, the process fluid is not supplied from the second discharge part into the process container, and in the second pressure increasing stage and the circulating process, the process fluid is not supplied from the first discharge part into the process container.

11. The substrate processing method of claim 9, wherein the second discharge part is formed of a tubular body having a plurality of holes formed in the tubular body.

12. A substrate processing apparatus comprising:
a process container in which a substrate is accommodated;
a substrate holder configured to hold the substrate horizontally in the process container in a state where a front surface of the substrate on which a liquid film is formed faces upward;

a main supply line connected to a process fluid supply part that supplies a process fluid in a supercritical state;

a first branch supply line and a second branch supply line that branch from the main supply line at a first branch point set in the main supply line;

a first discharge part connected to the first branch supply line and configured to discharge a process fluid, which is sent from the first branch supply line, toward a space in the process container below the substrate held by the substrate holder;

a second discharge part connected to the second branch supply line and configured to discharge the process fluid, which is sent from the second branch supply line, toward a space in the process container above the front surface of the substrate;

a fluid discharge part configured to discharge the process fluid from the process container;

a discharge line connected to the fluid discharging part;

an opening degree adjustable valve provided in the discharge line; and a controller configured to control operation of the substrate processing apparatus, wherein the controller is configured to cause the substrate processing apparatus to perform the substrate processing method of claim 1.

13. A substrate processing apparatus comprising:

a process container in which a substrate is accommodated;

a substrate holder configured to hold the substrate horizontally in the process container in a state where a front surface of the substrate on which a liquid film is formed faces upward;

a main supply line connected to a process fluid supply part that supplies a process fluid in a supercritical state;

a first branch supply line and a second branch supply line that branch from the main supply line at a first branch point set in the main supply line;

a first discharge part connected to the first branch supply line and configured to discharge a process fluid, which is sent from the first branch supply line, toward a space in the process container below the substrate held by the substrate holder;

a second discharge part connected to the second branch supply line and configured to discharge the process fluid, which is sent from the second branch supply line, toward a space in the process container above the front surface of the substrate;

a fluid discharge part configured to discharge the process fluid from the process container;

a discharge line connected to the fluid discharging part; and a controller configured to control operation of the substrate processing apparatus, wherein the controller is configured to cause the substrate processing apparatus to perform the substrate processing method of claim 9.

\* \* \* \* \*